(12) United States Patent
Goodman et al.

(10) Patent No.: US 9,147,588 B2
(45) Date of Patent: Sep. 29, 2015

(54) SUBSTRATE PROCESSING PALLET WITH COOLING

(75) Inventors: Daniel Goodman, Lexington, MA (US); Arthur Keigler, Wellesley, MA (US); Stephen Golovato, Lexington, MA (US); David Felsenthal, Marblehead, MA (US)

(73) Assignee: TEL NEXX, INC., Billerica, MA (US)

( * ) Notice: Subject to any disclaimer, the term of this patent is extended or adjusted under 35 U.S.C. 154(b) by 1213 days.

(21) Appl. No.: 11/716,538

(22) Filed: Mar. 9, 2007

(65) Prior Publication Data

US 2008/0220622 A1  Sep. 11, 2008

(51) Int. Cl.
| | |
|---|---|
| H01L 21/00 | (2006.01) |
| B05C 11/00 | (2006.01) |
| H01L 21/67 | (2006.01) |
| H01L 21/677 | (2006.01) |
| H01L 21/683 | (2006.01) |

(52) U.S. Cl.
CPC .... *H01L 21/67103* (2013.01); *H01L 21/67109* (2013.01); *H01L 21/67703* (2013.01); *H01L 21/6831* (2013.01)

(58) Field of Classification Search
CPC ............... H01L 21/67103; H01L 21/6831; H01L 21/67109; H01L 21/67703
USPC ................................................... 156/345.53
See application file for complete search history.

(56) References Cited

U.S. PATENT DOCUMENTS

| | | | |
|---|---|---|---|
| 4,264,943 A * | 4/1981 | Anderson et al. ............. | 361/511 |
| 4,534,816 A | 8/1985 | Chen et al. | |
| 5,160,152 A | 11/1992 | Toraguchi et al. | |
| 5,238,499 A | 8/1993 | van de Ven et al. | |
| 5,255,153 A | 10/1993 | Nozawa et al. | |
| 5,350,479 A | 9/1994 | Collins et al. | |
| 5,460,684 A | 10/1995 | Saeki et al. | |
| 5,493,782 A * | 2/1996 | Gulko ............................. | 30/228 |

(Continued)

FOREIGN PATENT DOCUMENTS

EP          1 336 985          8/2003

OTHER PUBLICATIONS

Dexter Magnetic Technologies, "Physical Vapor Deposition," Solutions by Application, http://www.dextermag.com/Physical-Vapor-Deposition.aspx (circa 2002-2004, last viewed on Jul. 5, 2007).

(Continued)

*Primary Examiner* — Parviz Hassanzadeh
*Assistant Examiner* — Nathan K Ford
(74) *Attorney, Agent, or Firm* — Rothwell, Figg, Ernst & Manbeck, P.C.

(57) ABSTRACT

A substrate processing pallet can cool a substrate. A substrate processing pallet can include a base member; an interface pad attachable to the base member, the interface pad having substantially the same coefficient of thermal expansion as the base member and adapted to facilitate cooling of the substrate; and a surface of the base member having features for aligning a substrate on the interface pad. A substrate processing pallet can also include a base member; an interface pad attachable to the base member; an electrostatic chuck for gripping the substrate during processing; an energy storage system for storing energy to sustain the electrostatic chuck at sufficient charge to sustain grip the substrate during processing; and a conduit for transporting gas to a backside of the substrate to facilitate cooling of the substrate.

27 Claims, 17 Drawing Sheets

(56) References Cited

U.S. PATENT DOCUMENTS

| | | | |
|---|---|---|---|
| 5,587,045 A * | 12/1996 | Keller et al. | 438/476 |
| 5,636,098 A | 6/1997 | Salfelder et al. | |
| 5,691,876 A | 11/1997 | Chen et al. | |
| 5,708,566 A * | 1/1998 | Hunninghaus et al. | 361/704 |
| 6,072,685 A | 6/2000 | Herchen | |
| 6,110,287 A * | 8/2000 | Arai et al. | 156/345.34 |
| 6,217,272 B1 | 4/2001 | Felsenthal et al. | |
| 6,278,600 B1 | 8/2001 | Shamouilian et al. | |
| 6,328,858 B1 | 12/2001 | Felsenthal et al. | |
| 6,365,879 B1 | 4/2002 | Kuibira et al. | |
| 6,530,733 B2 | 3/2003 | Klein et al. | |
| 6,552,892 B2 | 4/2003 | Carroll et al. | |
| 6,567,258 B2 | 5/2003 | Sexton et al. | |
| 6,682,288 B2 | 1/2004 | Klein et al. | |
| 6,821,912 B2 | 11/2004 | Klein et al. | |
| 6,905,333 B2 | 6/2005 | Cox | |
| 7,100,954 B2 | 9/2006 | Klein et al. | |
| 2002/0030960 A1* | 3/2002 | Ku | 361/234 |
| 2002/0034883 A1* | 3/2002 | Klein et al. | 438/761 |
| 2002/0083897 A1* | 7/2002 | Shang et al. | 118/723 R |
| 2002/0110449 A1* | 8/2002 | Arlt et al. | 414/808 |
| 2002/0170882 A1* | 11/2002 | Akiba | 216/67 |
| 2003/0032301 A1* | 2/2003 | Dhindsa et al. | 438/758 |
| 2004/0187791 A1* | 9/2004 | Busse et al. | 118/728 |
| 2005/0016454 A1 | 1/2005 | Kurita et al. | |
| 2005/0115822 A1 | 6/2005 | Maass et al. | |
| 2005/0241771 A1 | 11/2005 | Rattner et al. | |
| 2006/0021705 A1 | 2/2006 | Imai et al. | |
| 2006/0231390 A1* | 10/2006 | Mullapudi et al. | 204/298.02 |

OTHER PUBLICATIONS

Madhusudana, C.V., "Solid Spot Thermal Conductance of a Joint," in Thermal Contact Conductance, Ling (Ed.) Springer, NY, p. 23-43 (1996).

Madhusudana, C.V., "Gas Gap Conductance," in Thermal Contact Conductance, Ling (Ed.) Springer, NY, p. 45-63 (1996).

"Optical Disk Firm Moves Into 300-mm MRAM Equipment," SiliconStrategies, http://www.singulus.de/deutsch/3_presse/pressemeinungen/pop_up/silicon_170904.htm (last viewed on Sep. 28, 2004).

Pellicori, S., "Choosing Between Thermal Evaporation and Sputter Deposition," Coating Material News, 10(3): 5 pages (Sep. 2000).

Powell et al., "PVD for Microelectronics: Sputter Deposition Applied to Semiconductor Manufacturing," Academic Press, p. 141-166 (1999).

"Streamline II DVD R-Advanced Production System for all Recordable DVD-Formats," Singulus [news], Issue 25, 8 pages (May 2004).

Timaris, "Innovative Thin Film Sputtering System for TMR Technology," Singulus Product Brochure, 4 pages (Nov. 2003).

Timaris, "The PVD Cluster Tool With Exceptional 300mm Uniformity, Thickness Control, Surface Texture, Throughput and Cost of Ownership," Singulus Product Broshure, 6 pages (2004).

Timaris, Product Introduction, http://www.singulus.de/deutsch/4_produkte/tmr/tmr_03.htm (last viewed on Jul. 12, 2007).

Timaris, Product Introduction, http://www.singulus.de/deutsch/4_produkte/tmr/tmr_04.htm (last viewed on Jul. 5, 2007).

TMR Technology, Singulus Brochure, Annual Report 2003 for Singulus Technologies AG, 10 pages.

Wright et al., "Manufacturing Issues of Electrostatic Chucks," J.Vac. Sci. & Tec. B. 13(4), p. 1910-1916 (1995).

U.S. Office Action issued May 24, 2013 in co-depending divisional U.S. Appl. No. 12/901,173, filed Oct. 8, 2010.

U.S. Office Action issued Nov. 29, 2012 in co-pending divisional U.S. Appl. No. 12/901,173, filed Oct. 8, 2010.

U.S. Office Action issued Dec. 3, 2013 in co-pending divisional U.S. Appl. No. 12/901,173, filed Oct. 8, 2010.

* cited by examiner

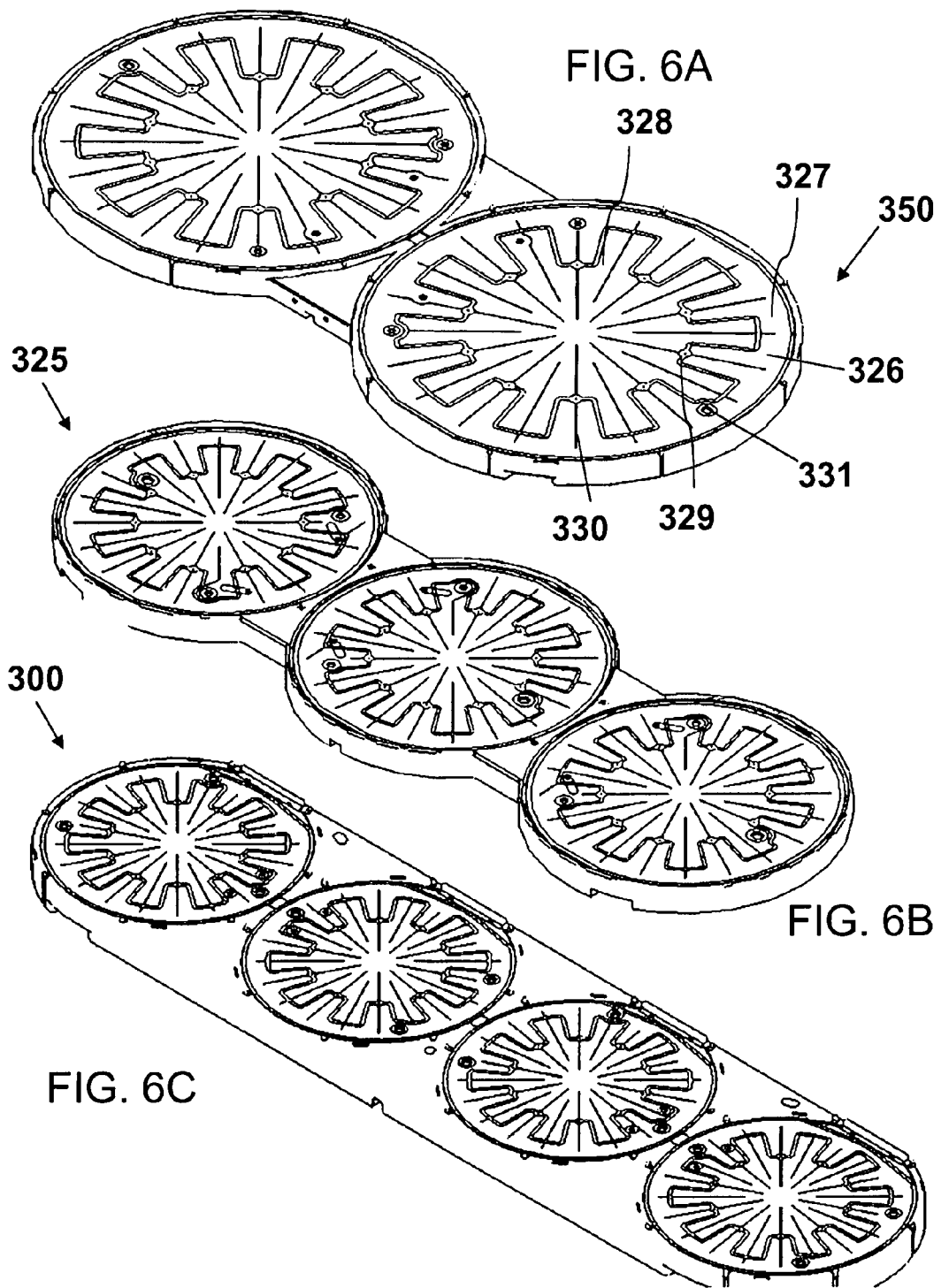

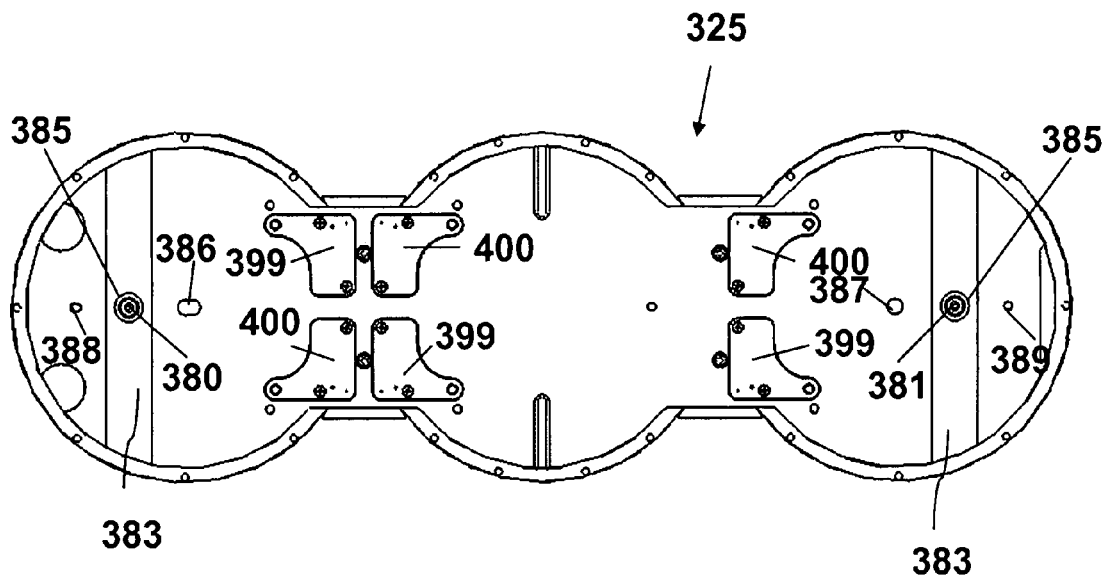
FIG. 8A
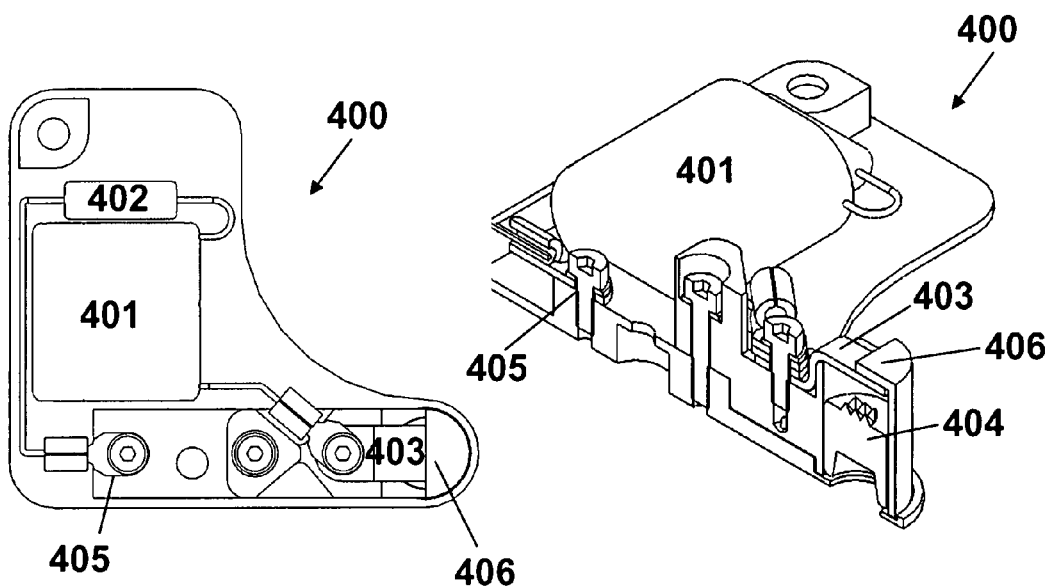
FIG. 8B
FIG. 8C

FIG. 13A
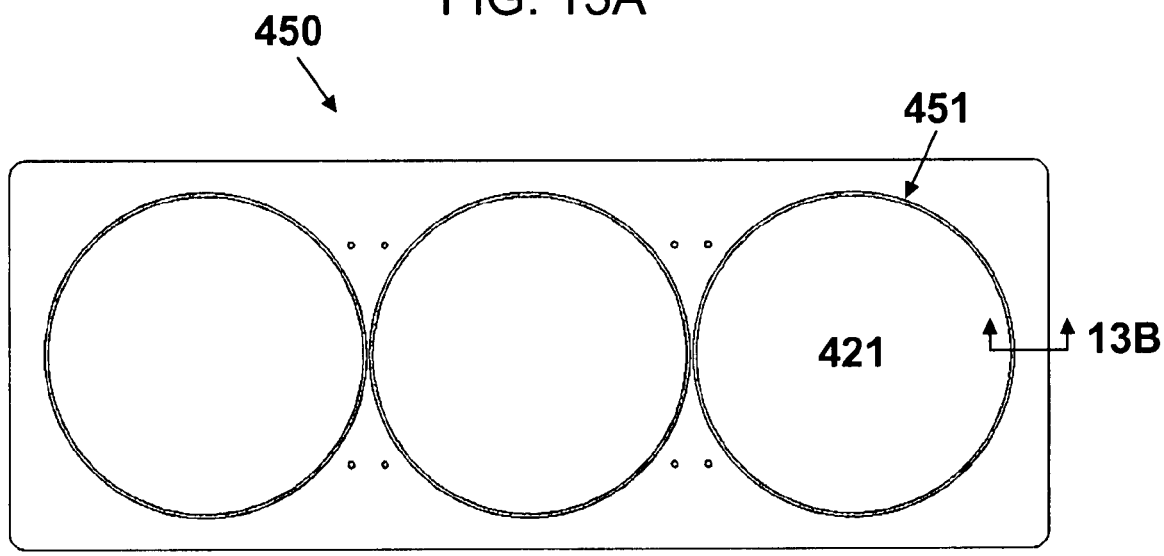
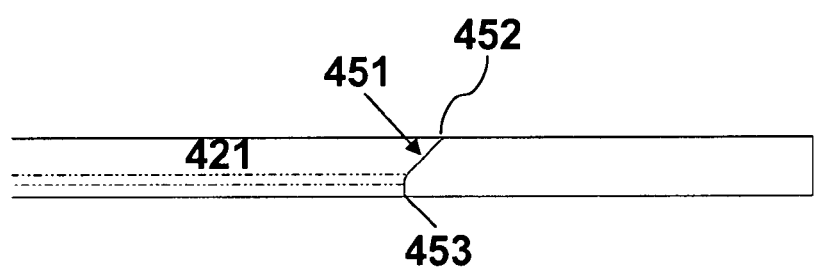
FIG. 13B

SUBSTRATE PROCESSING PALLET WITH COOLING

FIELD OF THE INVENTION

The invention relates generally to substrate processing pallets. More particularly, the invention relates to substrate processing pallets adapted to cool substrates and related methods and apparatus for cooling substrates.

BACKGROUND OF THE INVENTION

Substrate processing, such as semiconductor wafer processing, can raise the temperature of the substrate above an optimal processing value. For example, substrate heating during physical vapor deposition (PVD) can cause residual thermal stress in a deposited film, lead to poor adhesion of the deposited film, and otherwise damage sensitive substrates.

Some substrate processing tools use batch processing, whereby semiconductor wafers are transported on pallets through the tool and processed while held by self-contained wafer holders. For example U.S. Pat. Nos. 6,530,733, 6,682,288, and 6,821,912, the disclosures of which are incorporated herein by reference, describe substrate processing pallets for batch processing, related substrate processing machines, and methods in which the pallets are exposed to various temperatures during processing.

In general, the temperature of substrates processed on a pallet depends on the processing power and the degree of thermal contact between the substrate and the pallet. Temperature control can be accomplished by reducing the processing power, but this reduces the tool throughput, which is not desirable because it increases the processing cost per substrate. It is preferable to control temperature by maintaining sufficient thermal contact between the substrate and the pallet.

Semiconductor processing is often accomplished at low pressures in a vacuum chamber. Films deposited by PVD, for example, are often deposited at gas pressures of a few mTorr. At these low pressures, the thermal contact between surfaces is often low, and may not provide sufficient cooling for high throughput processing.

Substrate Cooling Principles:

Several general principles can maximize substrate cooling on a pallet. These include using pallet materials with high thermal conductivity, ensuring that the substrate and pallet are parallel and in good physical contact, decreasing the roughness of the surfaces, increasing the pallet heat capacity and increasing the gas pressure at the interface.

Materials with good thermal conductivity include various metals and ceramics. Good physical contact can be maintained by having flat, parallel substrate and pallet surfaces and by increasing the pressure of the substrate onto the pallet. Decreasing the surface roughness is accomplished by use of smooth polished surfaces, since smooth surfaces typically have twice the solid spot conductance of rough surfaces for the same pressure of substrate onto pallet. Increasing the heat capacity of the pallet improves cooling, because for the same process heat loading, the equilibrium tray temperature remains cooler.

Increasing the gas pressure at the interface increases substrate cooling, because heat transfer across a gap is primarily due to gas conduction, which is essentially a linear function of gas pressure under typical processing conditions. Increasing gas pressure at the interface to facilitate cooling is known as active cooling using backside gas pressure. In contrast, employing smooth surfaces to facilitate thermal conduction and cooling is known as passive cooling.

The substrate can be clamped against the pallet by mechanical or electrical means to increase the gas pressure at the interface. Clamping is necessary because otherwise the gas can either escape or possibly lift the substrate off the pallet. The electrostatic chuck (ESC) is an electrical method that permits uniform holding over virtually the entire substrate area and avoids edge exclusion and particles associated with mechanical clamps.

Pallets with Passive Cooling:

The simplest pallet consists of a tray fabricated from a single block of metal, such as aluminum. An improved surface smoothness can be achieved by bonding ceramic or semiconductor pads to the metal pallets to act as the interface between substrate and pallet. Silicon wafers can be used as interface pads because they are relatively inexpensive and are typically have sub-micron surface roughness resulting from chemical-mechanical polishing (CMP). A surface polished with CMP is much smoother than a metal pallet, with a resulting increase in substrate cooling. Such a tray is available as Part No. K11007815: Aluminum Silicon Tray Assembly, from NEXX Systems, Inc. of Billerica, Mass.

There are significant limitations to the substrate cooling ability of passive-cooling pallets made from either single metal block or containing ceramic or semiconductor interface pads. The surface finish and the flatness that can be achieved cost-effectively using standard metal fabrication techniques limit the cooling of simple metal pallets. Pallets containing ceramic or semiconductor pad interfaces are not robust because of thermal expansion mismatch between the metal pallet and the ceramic or semiconductor. As listed in Table 1, silicon has a thermal expansion coefficient approximately eight times smaller than the pallet's aluminum base metal. When such pallets are heated, the higher thermal expansion of the metal pallet can cause cracking of the pad, creating a rough surface and requiring expensive pad replacement.

TABLE 1

Thermal properties of materials used in substrate processing pallets over the 20° C.-80° C. pallet temperature use range. Values for aluminum are for a range of alloys. Values for alumina/PTFE are for a range of commercially available compositions.

| Interface Pad Material | Thermal Conductivity (W/cm° C.) | Thermal Expansion Coefficient (ppm/° C.) |
| --- | --- | --- |
| Aluminum | 1.5-2.4 | 21-25 |
| Silicon | 1.2-1.8 | 2.6-3.2 |
| Alumina/PTFE composite | 0.01-0.025 | 20-30 |

Pallets with Active Cooling:

A pallet can incorporate an electrostatic chuck (ESC) and active backside gas (BSG) cooling to facilitate cooling. Similar to capacitors, electrostatic chucks can hold a charge for a period of time after being disconnected from their power supply. The ESC self-discharge time depends on its material of fabrication and geometry, which determine the electrical resistivity and the ESC capacitance. Self-discharge times for ceramic or polyimide ESCs are shorter than the several minutes typical of semiconductor processing operations. This requires the ESC to be continuously connected to an energy source during processing.

Furthermore, pallets are transported through a tool, which prevents continuous electrical or gas connections. Instead, the connections are made and re-made as the pallet moves through the system. The electrical connections to the pallet can still be protected from plasma and arcing, just as in a fixed system, but in a way that allows for disconnection and re-connection.

Pallet Cleaning:

Pallets in a plasma processing environment require periodic cleaning. For example, thin films deposited on pallet areas not covered by substrates can be cleaned when the deposits exceed a certain thickness. A pallet can be removed from the tool and cleaned using mechanical or chemical means. Conventional pallets are often cleaned using grit blasting with abrasive media. However, such cleaning can harm delicate pallet features or embed abrasive media in areas from which they are difficult to remove. Chemical cleaning of the entire pallet is a preferable alternative to grit blasting, but pallets often contain adhesives or other polymeric materials which can be harmed by harsh chemicals used for cleaning.

SUMMARY OF THE INVENTION

In various embodiments, the invention relates to pallets adapted for holding substrates during processing and to substrate processing apparatus and methods adapted to employ the substrate processing pallets. A substrate processing pallet according to the invention provides features for cooling a substrate.

A pallet can improve substrate cooling by improving thermal contact between the pallet and the substrate. An interface pad can be used in a pallet to match the coefficient of thermal expansion of the substrate, to mitigate cracking the interface pad during processing. A pallet can also improve substrate cooling by improving backside gas pressure between the pallet and the substrate. An electrostatic chuck, which includes an energy storage system and does not need to be continuously connected to a power source, can be used to grip the substrate, to improve backside gas pressure during processing. The energy storage system can be adapted to increase the self-discharge time of the electrostatic chuck.

In one aspect, the invention features a substrate processing pallet having a base member, an interface pad, and a surface of the base member. The interface pad attaches to the base member, has substantially the same coefficient of thermal expansion as the base member, and facilitates cooling of the substrate. The surface of the base member has features for aligning a substrate on the interface pad.

In another aspect, the invention features a method for cooling a substrate on a substrate processing pallet. The method includes providing a base member, disposing an interface pad on a surface of the base member, and disposing the substrate on the interface pad. The interface pad has substantially the same coefficient of thermal expansion as the base member, facilitates thermal communication between the substrate and the base member, and facilitates cooling of the substrate.

In yet another aspect, the invention features a substrate processing pallet having a base member, an interface pad, an electrostatic chuck, an energy storage system, and a conduit for transporting gas. The interface pad attaches to the base member. The electrostatic chuck grips the substrate during processing. The energy storage system stores energy to sustain the electrostatic chuck at sufficient charge to sustain the grip on the substrate during processing. The conduit transports gas to a backside of the substrate to facilitate cooling of the substrate.

In still another aspect, the invention features a method for cooling a substrate on a substrate processing pallet. The method includes providing a base member; disposing an interface pad on a surface of the base member; disposing the substrate on the interface pad; charging an energy storage system; conducting energy from the energy storage system to the electrostatic chuck, to maintain grip of the substrate during processing; gripping the substrate with the electrostatic chuck; and transporting gas to a backside of the substrate to facilitate cooling of the substrate.

In other examples, any of the aspects above, or any apparatus or method described herein, can include one or more of the following features. In various embodiments, the base member can include aluminum. In some embodiments, a bonding layer can be used to bond the base member and the interface pad. The interface pad can be a composite material. The composite material can be an alumina particulate and a polymer matrix.

In certain embodiments, the substrate processing pallet includes at least one recess adapted to receive a substrate. The recess includes a support structure adapted to contact a portion of the substrate through the composite interface pad. The substrate processing pallet can include a plurality of apertures through each of which a lift pin may extend to initially support the substrate above the recess and to subsequently retract to deposit the substrate onto the composite interface pad. The substrate processing pallet can also feature a plurality of side surfaces. At least one of the side surfaces can have a process positioning feature adapted to engage with a process chamber feature located inside of a process chamber to particularly position the pallet within the process chamber in response to the pallet being placed into the process chamber. At least one of the side surfaces can have a transport positioning feature adapted to engage with a first end effector alignment feature of a first transport mechanism to particularly position the pallet with respect to the end effector. At least one of the side surfaces can have one or more support features. Each support feature can be adapted to engage with a corresponding end effector support feature of the transport mechanism to support the pallet on the end effector during transport.

In various embodiments, a removable, chemically resistant cover can facilitate cleaning. The chemically resistant cover can include a feature adapted for positioning and/or gripping the substrate.

In some embodiments, an electrostatic chuck can include a polyimide.

In certain embodiments, the pallet can be cooled. The means for cooling the pallet can include a water cooled plate in thermal communication with the pallet. The means for cooling the pallet can also include an interface layer disposed between the pallet and the means for cooling the pallet, to facilitate thermal conductance between the pallet and the means for cooling the pallet.

In various embodiments, a process alignment feature can match corresponding tray alignment features, to facilitate the use of a close tolerance process shield. The shield can be a metal cover adapted to lift during charging and covers a hole during processing.

In some embodiments, a charger can charge the energy storage system, a conductor can conduct energy from the energy storage system, and a shield can prevent charged particles from contacting the conductor. The energy storage system can include a high voltage capacitor. The high voltage capacitor can include polypropylene film. The charger can include a spring loaded contact providing power.

In certain embodiments, gas can be provided to the pallet. The means for providing gas to the pallet can be a transport finger that engages with a suction cup.

In various embodiments, the conduit includes a gas channel, a gas channel seal, a gas distribution system within the pallet, and a gas delivery outlet for uniform gas delivery.

In some embodiments, a sensor can measure a gas pressure at the backside of the substrate.

In certain embodiments, the electrostatic chuck also includes a discharge circuit for automatically discharging the energy storage system.

Other aspects and advantages of the invention will become apparent from the following drawings and description, all of which illustrate principles of the invention, by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

FIGS. 6A-6C are perspective views of various active cooling substrate processing pallets.

FIG. 8A is a view of an active cooling substrate processing pallet.

FIG. 8B is a detail view of the modular charging system of the active cooling substrate processing pallet.

FIG. 8C is a perspective view of the modular charging system of the active cooling substrate processing pallet.

FIG. 13A is a top view of a processing shield.

FIG. 13B is a cross-section view of a section of the processing shield of FIG. 13A.

DESCRIPTION OF THE INVENTION

Figure 1:
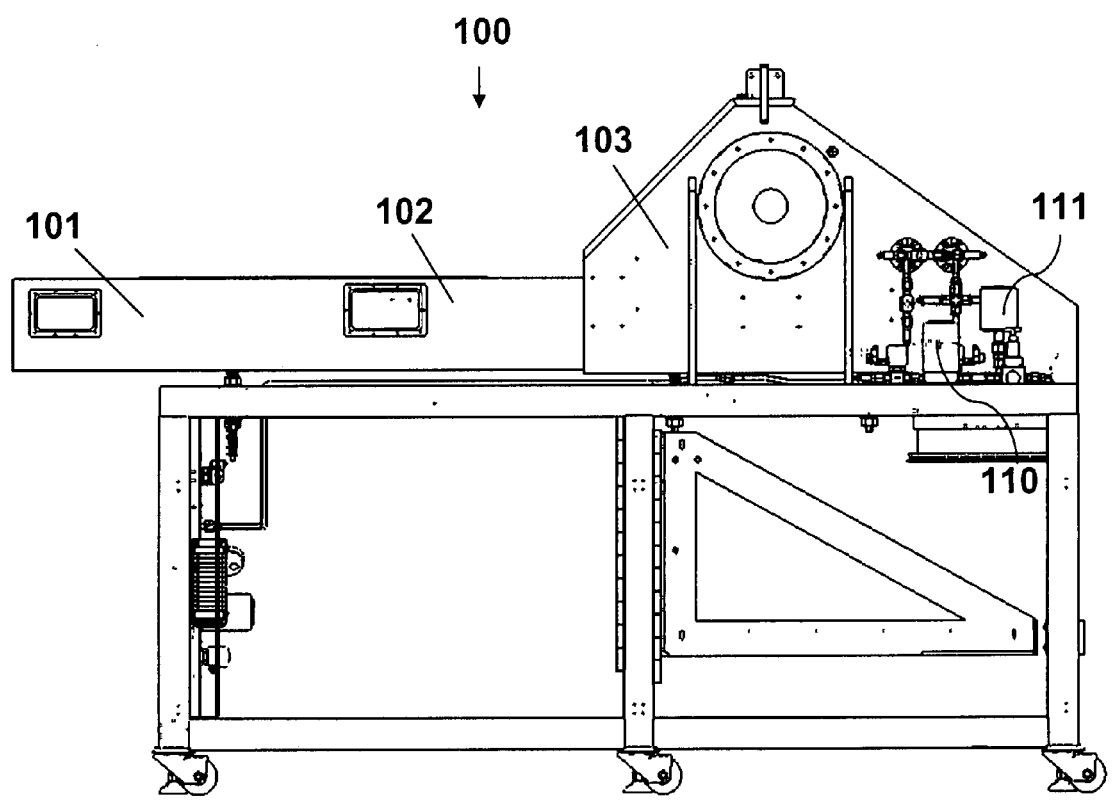
FIG. 1 is a cross-section view of an inline substrate processing machine having illustrative features of the invention.

FIG. 1 is a side, schematic view of an inline substrate processing machine 100 including of a load-lock module 101, a first processing chamber 102 and a second processing chamber 103. A transport mechanism, such as that described in U.S. Pat. No. 6,530,733, the disclosure of which is incorporated herein by reference, moves pallets holding substrates between each chamber. Substrates are placed onto pallets in the load-lock 101 by a robotic end-effector (not shown). In operation, pallets are located in each chamber. After the pallet is filled with substrates and air is evacuated from the load-lock 101, the pallet is transported to the first processing chamber 102, then to the second processing chamber 103, and then back to the load-lock 101 for recovery of the processed substrates. The substrate processing machine 100 also includes mass flow controller (MFC) 110 and a capacitance manometer 111 to facilitate processing in the second processing chamber 103.

Figure 2A:
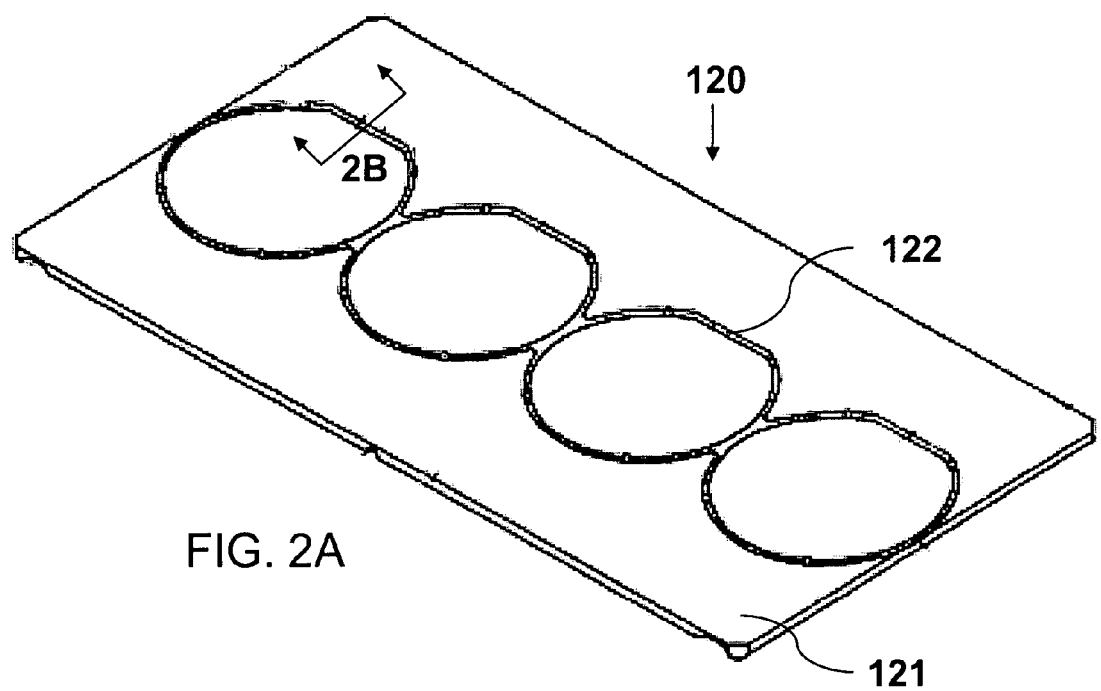
FIG. 2A is a perspective view of a prior art active cooling pallet.

FIG. 2A shows a pallet 120 that is fabricated by milling of a single block of aluminum. Recess pocket features 122 locate the substrate and maintain proper substrate positioning during processing.

Figure 2B:
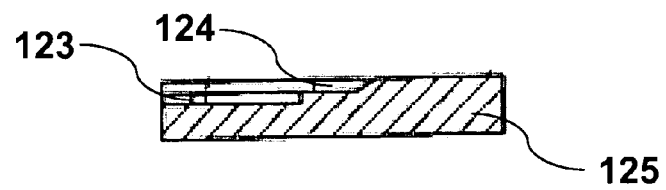
FIG. 2B is a cross-section detail of features of a prior art active cooling pallet.

FIG. 2B shows details of the recess pocket, including the pocket floor 123 and the restraining lip 124. When located in the pocket, the substrate rests directly on the aluminum base metal 125 without an interface pad.

Figure 3A:
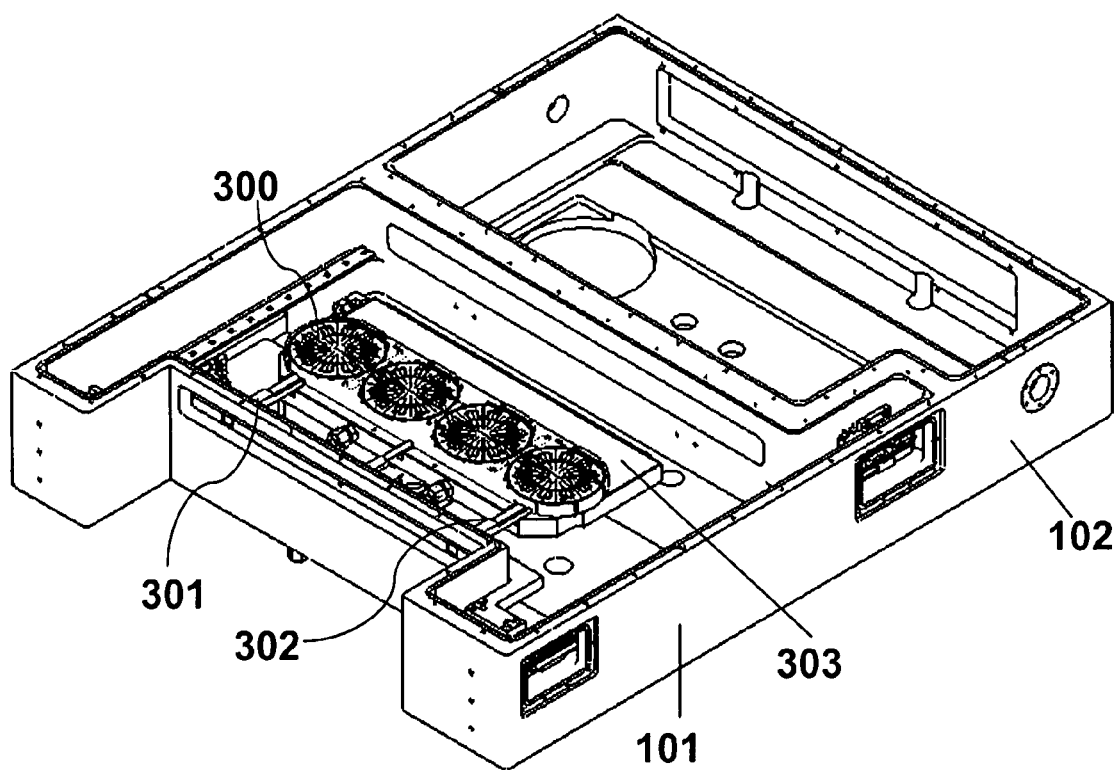
FIG. 3A is a perspective view of a portion of an inline substrate processing machine having illustrative features of the invention.

FIG. 3A shows a load-lock module 101 of an inline substrate processing machine 100 adapted to employ a substrate processing pallet 300, as well as provide the necessary transport, electrical, and gas interfaces. The substrate processing pallet 300 is shown prior to substrate loading. The water-cooled lift plate 303 is capable of vertical motion, and the transport fingers 301 and 302 are capable of horizontal motion. In some embodiments, the water-cooled lift plate 303 is a cooling plate that is not water cooled. The pallet is shown resting on the water-cooled lift plate 303, and the fingers 301 and 302 are in recessed slots in the cooling plate. When in a downward, retracted position, the pallet rests on transport fingers 301 and 302.

Figure 3B:
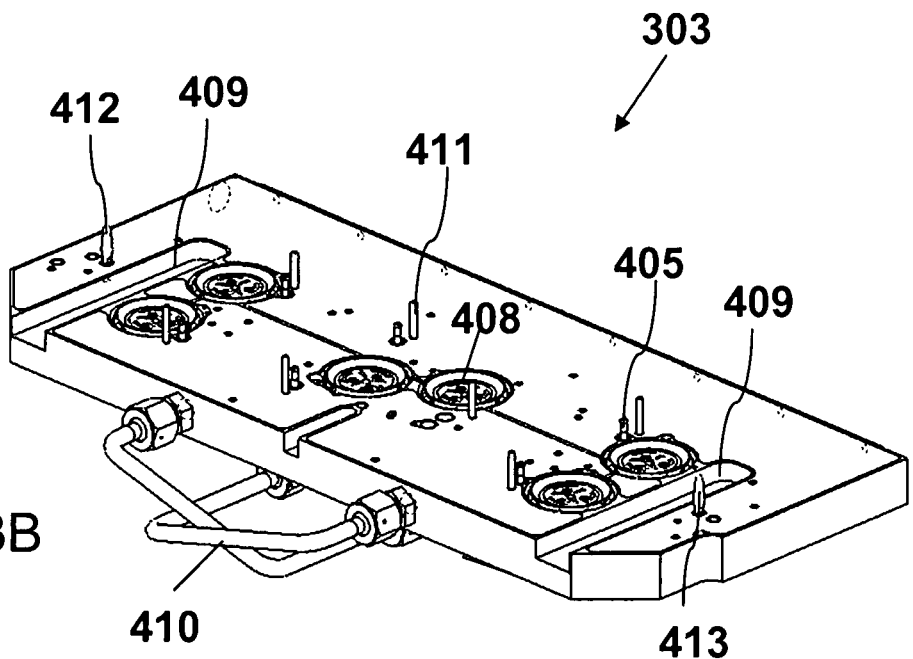
FIG. 3B is a perspective view of the cooled lift-plate portion of the inline substrate processing machine shown in FIG. 3A.

FIG. 3B shows the water-cooled lift plate 303 of FIG. 3A, including recessed slots 409, water cooling lines 410, an electrostatic chuck charging pin 415, a suction cup 408 and a substrate lift pin 411. During processing, the substrate processing pallet 300 acts as a thermal mass conducting heat away from the substrate. When the pallet is returned to the load-lock 101, this heat is transferred to the water-cooled lift plate 303. Suction cups 408 pull the pallet 300 toward the water-cooled lift plate 303, increasing the contact force and thus facilitating cooling of the pallet 300.

Figure 3C:
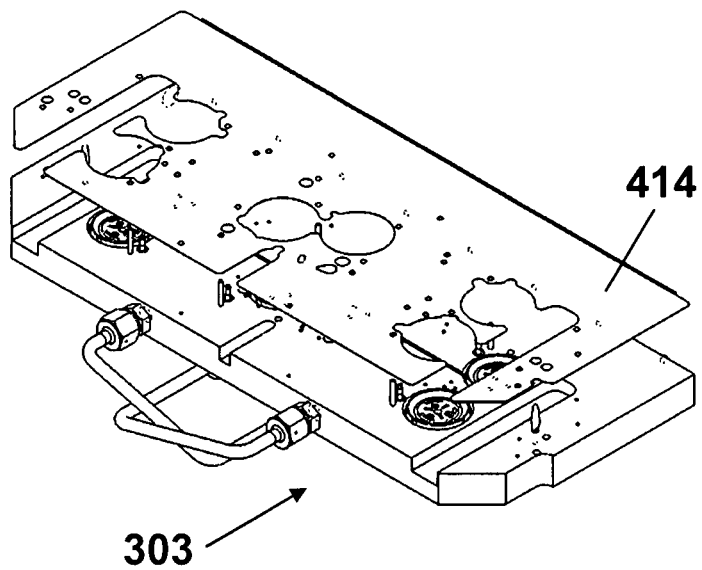
FIG. 3C is an exploded view of the cooled lift-plate portion of the inline substrate processing machine shown in FIG. 3A showing the thermal substrate material.

FIG. 3C shows an interface material 414, which can be disposed between the pallet 300 and the water-cooled lift plate 303 to facilitate cooling of the pallet 300. In one embodiment, the interface material 414 is a 0.005" thick layer of aluminum bonded to the lift-plate using a 0.005" thick layer of THERMATTACH® T405 material, available from the Chomerics Division of the Parker-Hannifin Corporation, Woburn, Mass.

Figure 4:
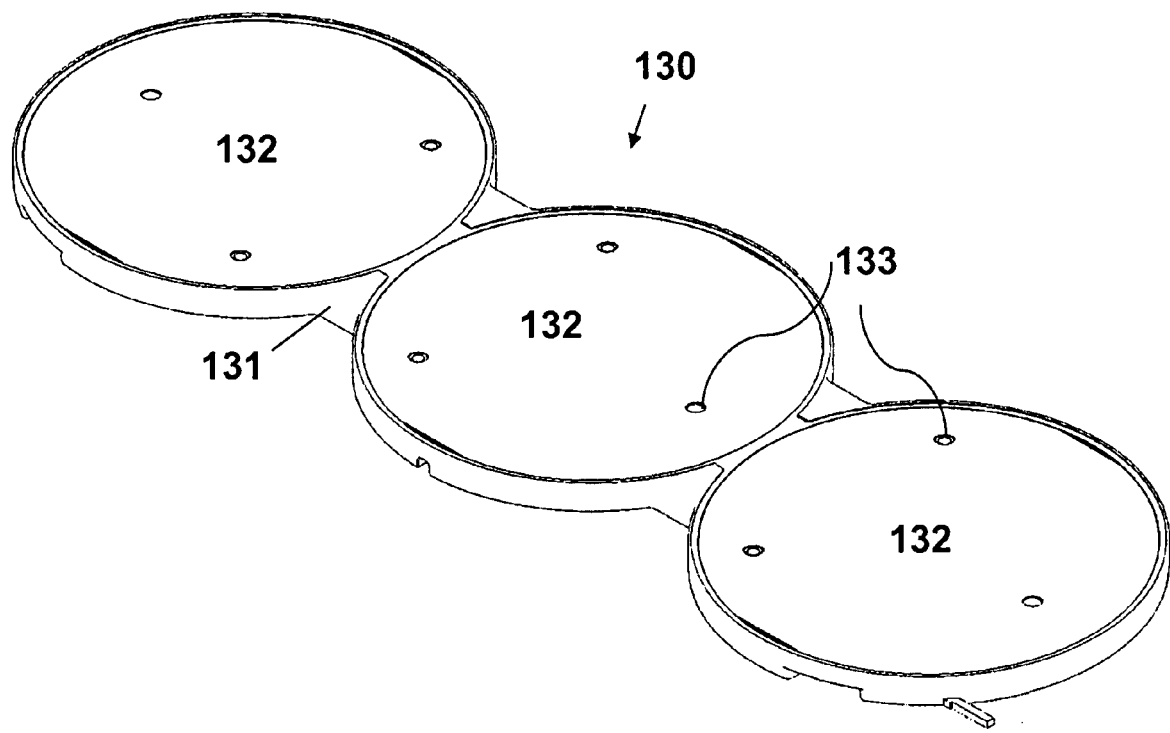
FIG. 4 is a perspective view of an active cooling substrate processing pallet.

FIG. 4 shows a passive cooling substrate processing pallet 130 designed to transport and cool three 200 mm diameter substrates. The system can be adapted for 100 mm, 150 mm, and 300 mm substrates, as well as other sizes depending on the application. The base 131 is manufactured from aluminum. The interface 132 includes a polymer-ceramic composite with a thermal expansion coefficient closely matched to aluminum, bonded to an aluminum pad. The holes 133 allow lift pins inserted in the cooled lift plate to raise and lower the substrate from the pallet 130.

Figure 5:
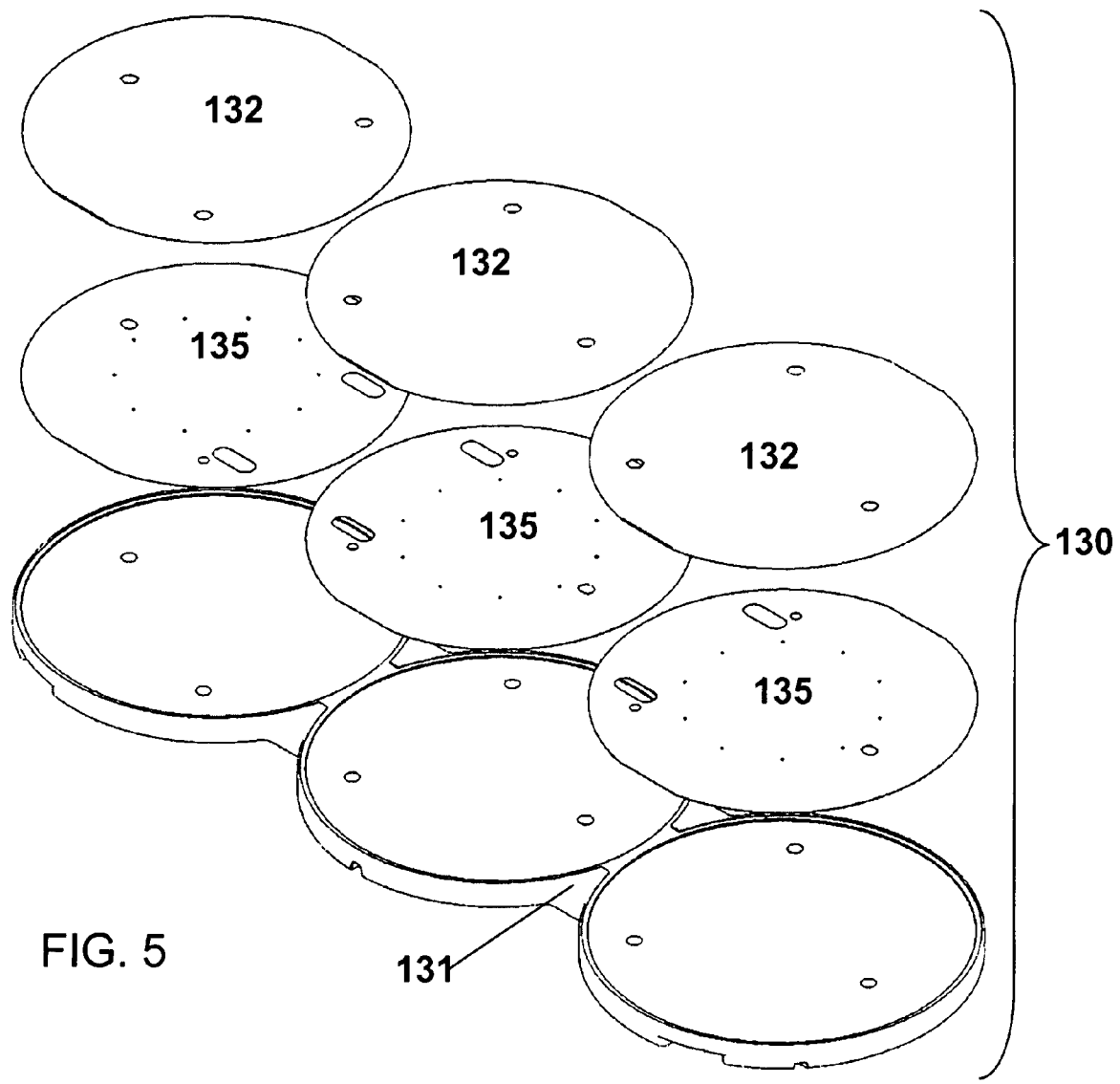
FIG. 5 is an exploded view of the substrate processing pallet of FIG. 4 having illustrative features of the invention.

FIG. 5 shows the components of the substrate processing pallet 130, including interface pads 132, bonding layers 135, and the base 131. In various embodiments, the interface pads 132 include a composite material having alumina particulate reinforcement in a matrix of PTFE Teflon laminated to an aluminum base. Such a composite material is available in various reinforcement concentrations as the THERMAL CLAD® product line from the Bergquist Company of Chanhassen, Minn. In one embodiment, the composite material is THERMAL CLAD® LT1. In one embodiment, the interface pads 132 are LT1 pads with a dielectric thickness of 0.003" laminated to a 0.040" thick aluminum base plate. In various embodiments, the composite material creates a hard, flat, scratch-resistant surface with a thermal conductivity nearly equal to the aluminum base 131.

The bonding layer 135 can be, for example, a double-sided pressure-sensitive thermal adhesive tape with an aluminum foil carrier. In various embodiments, the bonding layer 135 is a low-outgassing vacuum-compatible material with total material loss of <1% and a maximum collected volatile condensable material rating of <0.1% as tested according to ASTM Standard E 595-77/84/90. In one embodiment, the bonding later 135 is THERMATTACH® T405 available from the Chomerics Division of the Parker-Hannifin Corporation, Woburn, Mass.

FIG. 6A shows an active cooling substrate processing pallet 350 having two integrated electrostatic chucks 326, each designed to hold and cool a 300 mm diameter substrate. Each chuck 326 consists of an outer electrode region 327 and an inner electrode region 328. Each chuck 326 has a plurality of gas cooling holes 329 and gas flow channels 330 designed to provide uniform backside gas pressure. Each chuck 326 also has lift pin holes 331, which are analogous to holes 133 in FIG. 4.

FIG. 6B shows an active cooling substrate processing pallet 325, which is designed to hold three 200 mm diameter substrates and include the features of the active cooling substrate processing pallet 350 described in FIG. 6A.

FIG. 6C shows an active cooling substrate processing pallet 300, which is designed to hold four 150 mm diameter substrates and include the features of the active cooling substrate processing pallet 350 described in FIG. 6A.

Figure 7A:
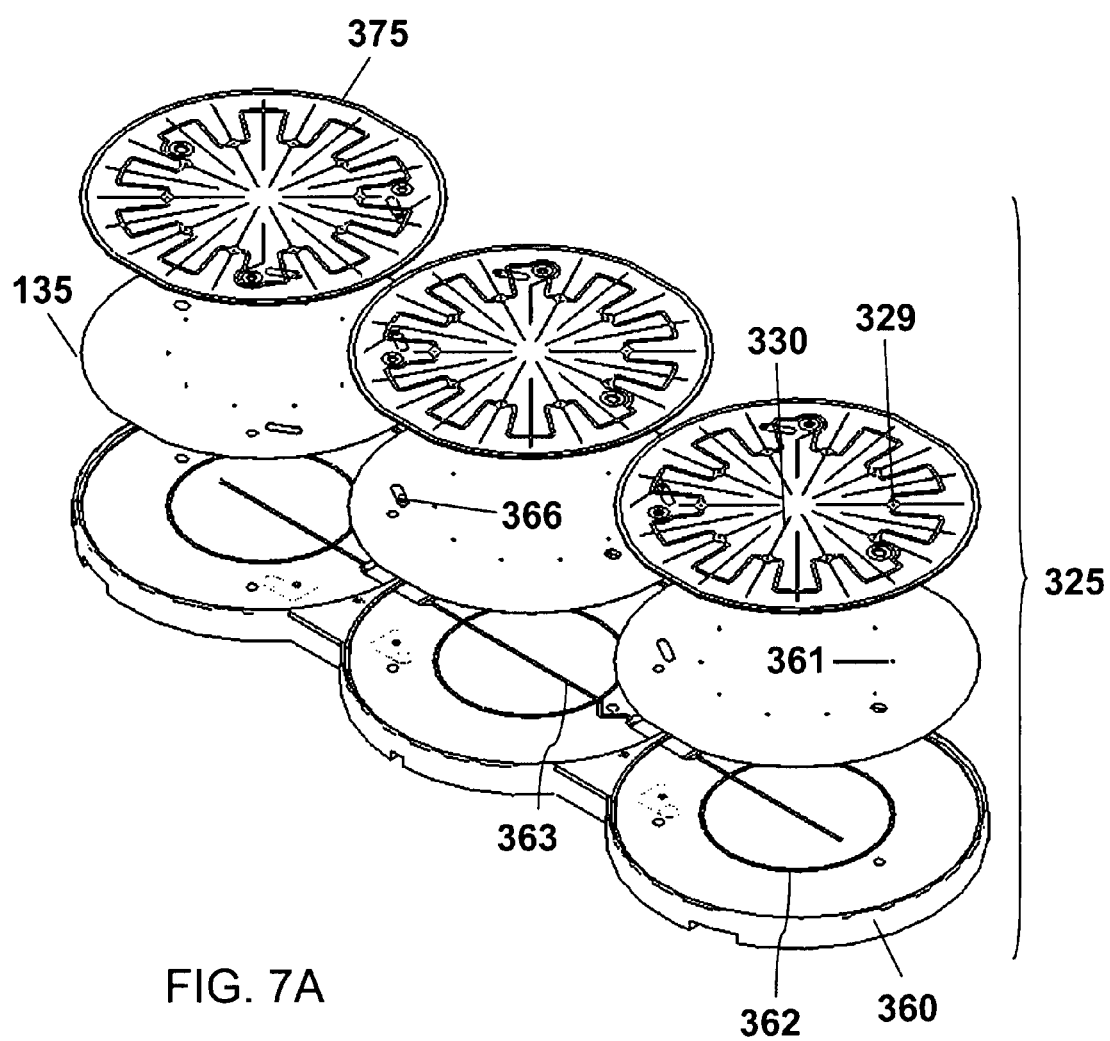
FIG. 7A is an exploded view of an active cooling substrate processing pallet.

FIG. 7A shows the components of the substrate-processing pallet 325 shown in FIG. 6B. The pallet 325 has an aluminum base 360 into which gas distribution channels 362 and 363 are milled. However, the base can also be manufactured from another metal or material with similar thermal and mechanical properties as aluminum. Electrostatic chucks 375 are bonded to the base 360 using the bonding layer 135. The bonding layer 135 has a plurality of holes 361, which align with cooling holes 329 in the electrostatic chucks 375, to transport gas to cooling holes 329 and gas flow channels 330. The bonding layer 135 also includes cutout regions 366. The gas flow channels 330 can be formed by lithographic etching.

Figure 7B:
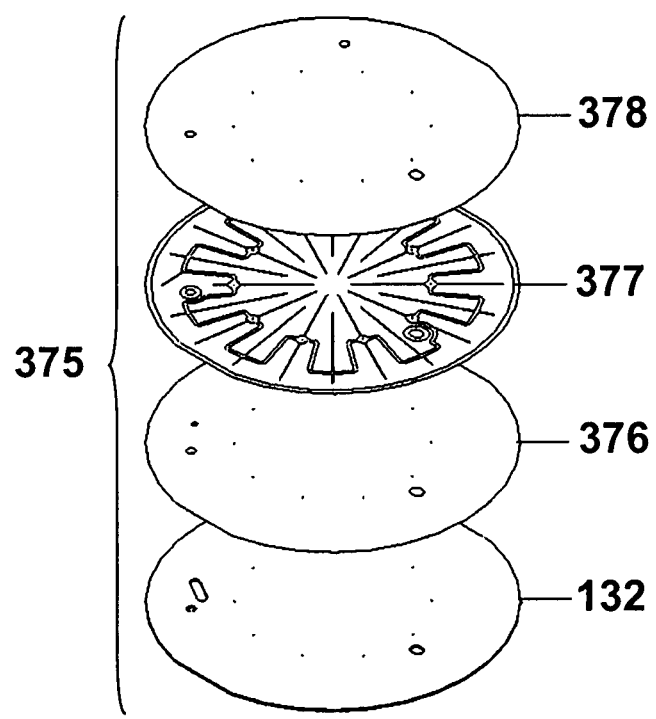
FIG. 7B is an exploded view of the electrostatic chuck portion of the active cooling substrate processing pallet.

FIG. 7B shows the components of the electrostatic chuck 375. The base layer 132 can include a dielectric layer to provide electrical insulation between the base layer 132 and an electrode layer 377. The electrode layer 377 can include copper. The electrode pattern in the electrode layer 377 can be manufactured, for example, using a lithographic technique, such as those commonly used to produce flexible circuits. The electrode layer 377 includes cutout regions 366 that allow electrical connection to be made. In various embodiments, the bonding layer 376 is a heat-curable adhesive layer. In various embodiments, the outer layer 378 is a polyimide film laminated to the electrode layer 377. In one embodiment the polyimide film bows in the area etched into the electrode layer 377, to form the gas flow channels 330.

In one embodiment, the bonding layer 376 is a 0.001" heat curable acrylic film adhesive. One preferred adhesive is PYRALUX® LF0100 Sheet adhesive. In one embodiment, the electrode layer 377 and outer layer 378 are PYRALUX® FR9120 copper clad laminate with a 1 oz/ft$^2$ copper layer, 0.001" thick adhesive and 0.002" thick Kapton polyimide film. Both PYRALUX® materials are available from the DuPont Electronic Materials Company of Research Triangle Park, N.C.

FIG. 8A shows the bottom of the substrate-processing pallet 325, which includes transport and alignment features that are specific to each processing chamber. One transport feature is the parallel slot recesses 383, which are each designed to accept transport fingers 301 and 302 shown in FIG. 3. The gas inlet 380 and gas outlet 381 are aligned with gas holes in transport fingers 301 and 302. Suction cups 385 attach to the gas inlet 380 and gas outlet 381, to provide a seal when the substrate-processing pallet rests on the transport fingers 301 and 302. Pallet alignment features 388, 389, 386, and 387 facilitate positioning the pallet.

FIG. 8A also shows six integrated energy storage modules: three energy storage units 399 that have capacitors to be charged to one voltage polarity and three energy storage units 400 that have capacitors to be charged to the opposite polarity. The substrate-processing pallet 325 can be a bi-polar electrostatic chuck requiring access to at least two such modules, one for each voltage polarity. Various other embodiments can have a plurality of chucks connected in parallel to an even number of energy storage modules. In one embodiment, the energy storage unit 399 or 400 is chargeable, removable, and can be separated into a plurality of modules. A preferred energy storage unit or module is a high-voltage capacitor with sufficiently low leakage current to maintain an approximately full electrostatic chuck charge during processing.

FIG. 8B shows the bottom of the energy storage unit 400 including a high-voltage storage capacitor 401, discharge resistor 402, and high-voltage contact 403. An insulated wire (not shown) connects electrostatic chuck electrode to the high-voltage contact 403 by means of the ground terminal 405.

FIG. 8C shows the top of the energy storage unit 400. The charging pill 404 and high-voltage contact 403 together constitute a normally-open switch which is closed when the pill is pushed up against the contact during charging. An insulating support structure 406 constrains and guides charging pill 404.

In various embodiments, the high-voltage capacitor is a polypropylene film type capacitor that exhibits relatively low leakage current over an about 20° C. to about 80° C. substrate processing temperature range. In one embodiment, the capacitor is the 630V, 0.43 uF model ECWF6434 manufactured by the Panasonic Corporation.

Figure 9:
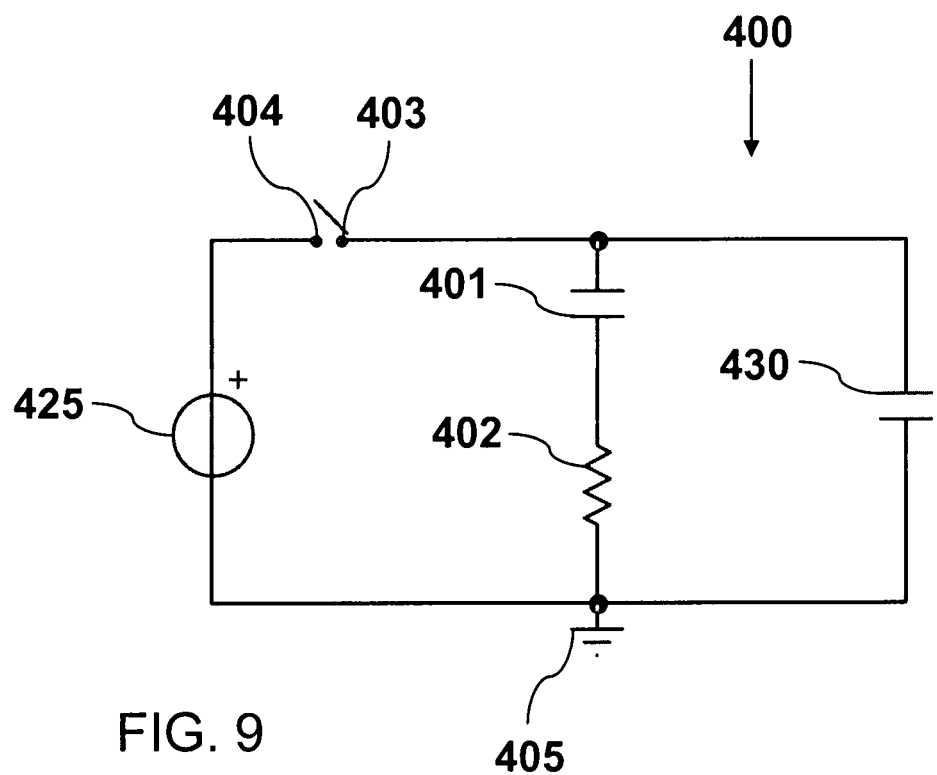
FIG. 9 is a circuit schematic of the modular charging system of FIG. 8C.

FIG. 9 shows a circuit schematic for the energy storage unit 400, including an external high-voltage power supply 425, the charging pill 404 and high-voltage contact 403, storage capacitor 401, discharge resistor 402, electrostatic chuck electrode 430, and ground terminal 405.

An active cooling pallet may have means to automatically discharge the storage system to ensure safe handling. The means to automatically discharge the storage system can be a discharge circuit that includes a resistor in series with the storage capacitor, the value of which results in the minimum stored charge when the pallet, charged in the vacuum chamber, is vented to atmosphere. In various embodiments, the energy storage module automatically discharges when vented to atmosphere, which can facilitate system reproducibility and safe handling. In one embodiment, a storage capacitor that is charged to high voltage in vacuum can automatically discharge to a value of less than about 50 V.

The value of discharge resistor 402 can be optimized by charging the storage capacitor 401 to full voltage in the load-lock 101 under high vacuum conditions, venting the load-lock to the atmosphere, which creates an arc discharge inside the module, and then measuring the remaining capacitor voltage. An optimal resistor value results in the minimum residual voltage and generally depends on the choice of storage capacitor. In one embodiment, the discharge resistor 402 is a 1000 Ohm, ½ W carbon composition resistor.

Figure 10A:
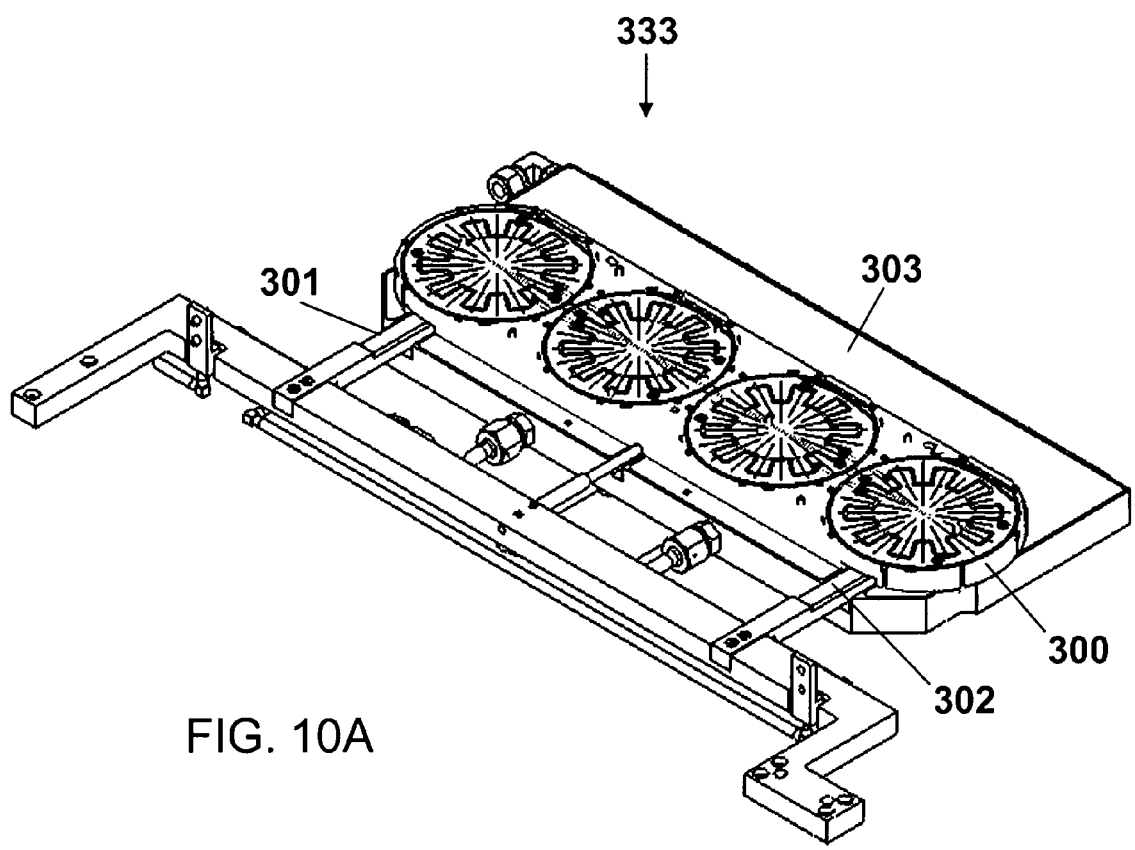
FIG. 10A is a perspective view showing the transport fingers and lift pin-plate assembly portions of the processing machine shown in FIG. 1 and the substrate processing pallet of FIG. 6C.

FIG. 10A shows an assembly 333 including the processing-pallet 300 positioned on transport fingers 301 and 302 and the water-cooled lift plate 303, which can be inside the load-lock 101.

Figure 10B:
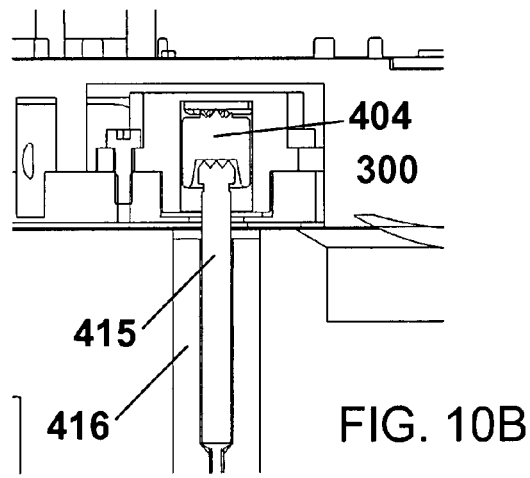
FIG. 10B is a cross-section view of the charging system portion of the pin plate lift assembly.

FIG. 10B shows the charging system portion of the assembly 333. During charging, the water-cooled lift plate 303 is in a raised position, so that charging pill 404 is in contact with the high-voltage contact 403. Voltage from external high-voltage power supply 425 is conducted to the modular energy storage modules 399 or 400 by the charging pin 415, which is insulated by the insulating sleeve 416. After charging, the water-cooled lift plate 303 is lowered to a retracted position, so that pallet 300 rests on transport fingers 301 and 302, and charging pill 404 rests on the grounded lower cover of module 400. In this lowered position, charging pill 404 prevents charged particles from entering charging module 400, thus preventing arcing or discharge of capacitor 401.

Figure 10C:
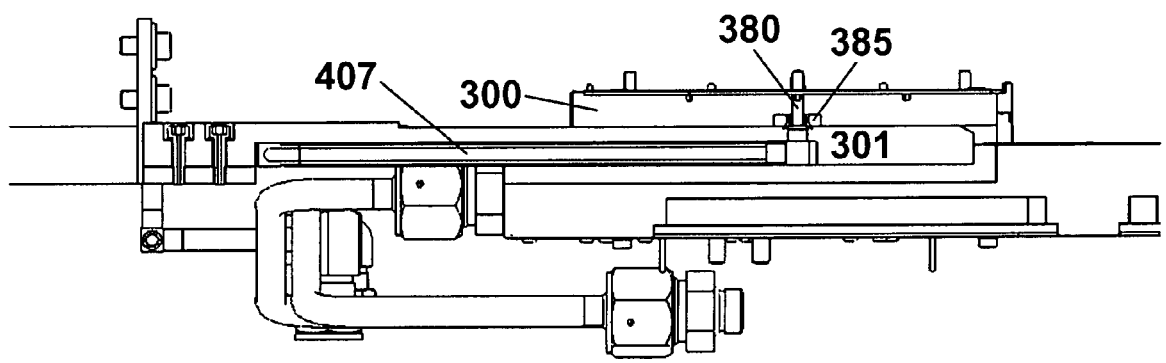
FIG. 10C is a cross-section view showing the gas distribution system, transport fingers and lift pin-plate assemblies.

FIG. 10C is a side, cross-section view of the processing pallet 300 and transport finger 301. A tube 407 inside the transport finger 301 transports gas to the underside of processing pallet 300. Suction cup 385 provides a seal between the transport finger 301 and gas inlet 380. During processing, gas flow can be provided to the transport fingers by the MFC 110. Gas flow can be controlled by a feedback loop which uses the backside gas pressure as the controlling variable. Gas pressure can be monitored by the capacitance manometer 111. A preferred instrument, which contains both the MFC and manometer, is the Model 649 Controller available from MKS Instruments of Wilmington, Mass.

The following process steps illustrate the operation of the load-lock hardware shown in FIGS. 3 and 10 and the features of the active cooling pallet 300.

1. Load one or more substrates onto the pallet 300 by robotic means.
2. Evacuate load-lock 101 to a pressure of about $10^{-5}$ Torr or less.
3. With water-cooled lift plate 303 in the raised position, supply high-voltage to charge the energy storage modules 399 or 400. Optionally, test the self-leakage rate of storage module 399 or 400 and electrostatic chuck 375.
4. With the water-cooled lift plate 303 in a lowered position, rest the processing pallet 300 on the transport fingers 301 and 302 to establish a seal.
5. Direct gas through the transport fingers 301 and 302 to the backside of the substrate using the MFC 110.
6. Using the control loop, set the flow to achieve the desired backside pressure.
7. If the equilibrium flow is within a pre-determined range, then the system is functioning properly, and the pallet is ready for further processing. Otherwise various corrective actions are taken to handle the fault, which can be due to either substrate or pallet problems.

Figure 11:
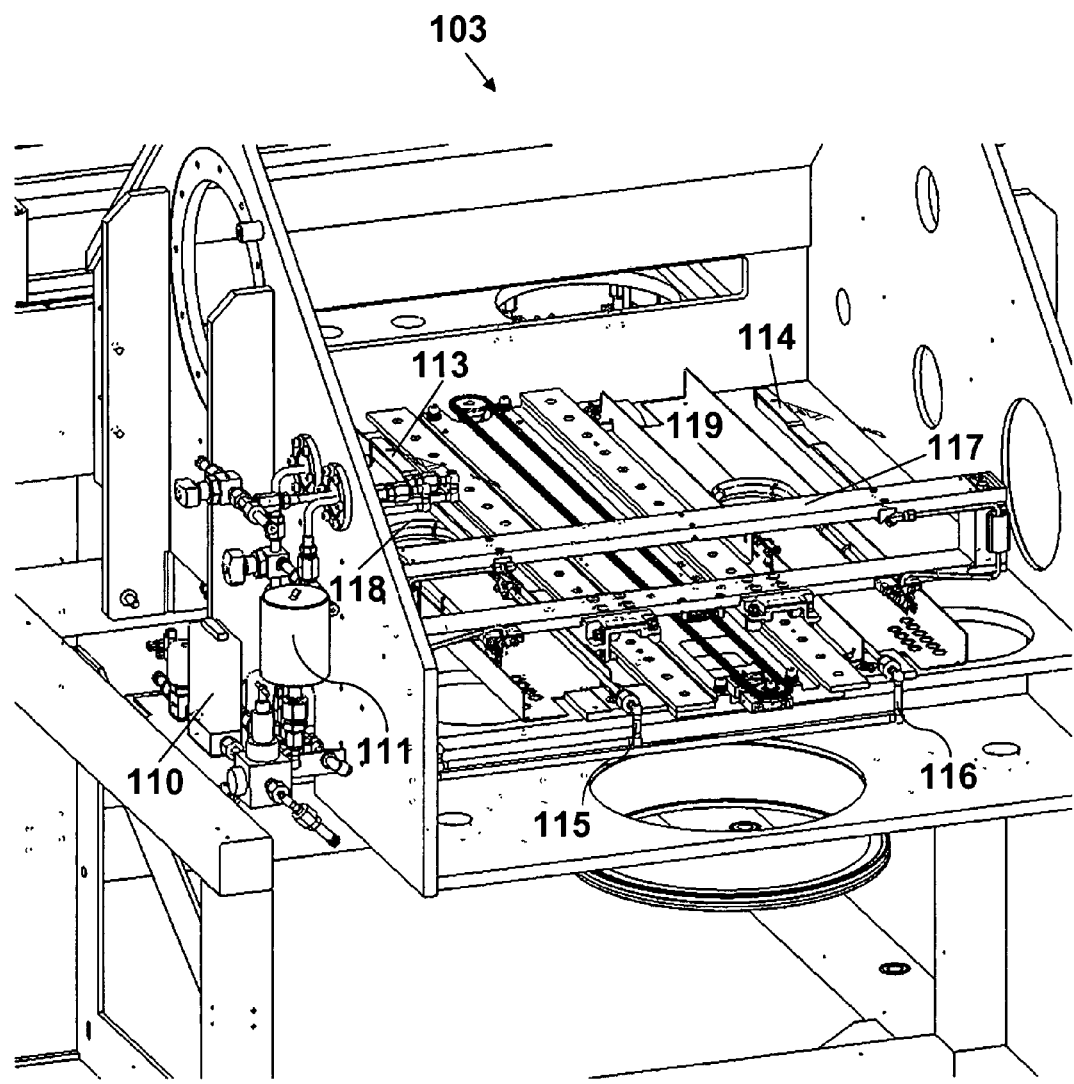
FIG. 11 is a perspective view of a processing chamber portion of an inline substrate processing machine having illustrative features of the invention.

FIG. 11 shows the second processing chamber 103, which can provide the necessary environment for processing using either a passive cooling pallet 130 or an active cooling pallet 300. The passive cooling pallet 130 or active cooling pallet 300 rests on the transport fingers 113 and 114. The transport fingers 113 and 114 are attached to a transport crossbar 117, which can scan the pallet back-and-forth under a linear deposition curtain to deposit a uniform film on the substrate.

When processing with an active cooling pallet 300, the mass flow controller 110 directs gas into the processing chamber 103 through rigid tubing 115 and flexible tubing 118 to the transport finger 113. An active cooling pallet 300 (not shown) receives gas through inlet 380. The gas outlet 381 can be connected to a capacitance manometer 111 by flexible tubing 119 and rigid tubing 116. During processing, a feedback control loop can vary the gas flow output of the MFC 110 to maintain a constant value of backside gas pressure as measured by the capacitance manometer 111.

Figure 12A:
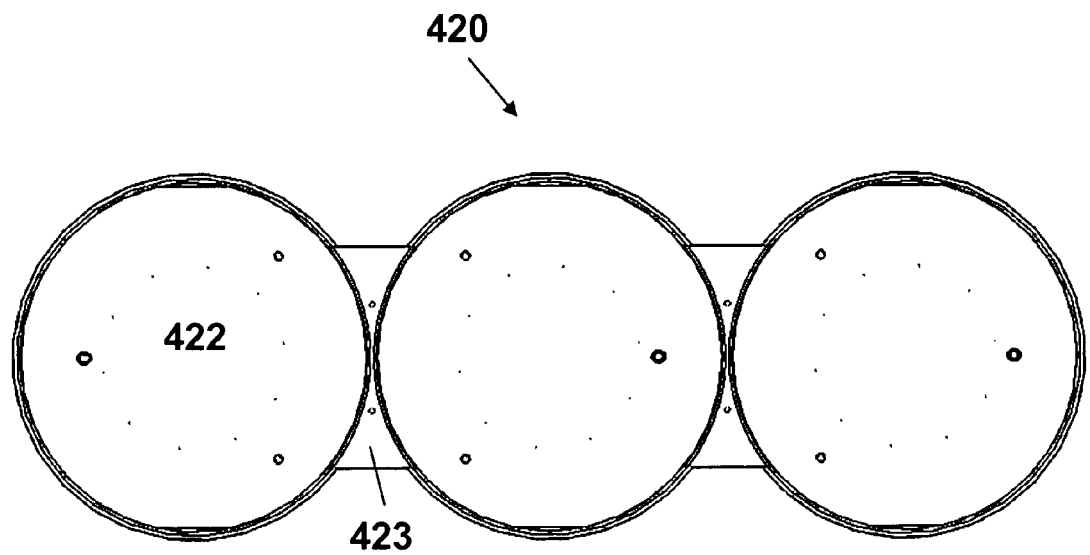
FIG. 12A is a top view of a substrate processing pallet after removal of a cleanable rim.

FIG. 12A shows a substrate processing pallet 420 adapted to receive a cleanable rim (not shown). The pallet 420 includes a pallet body 422 and a mount 423 for a cover (not shown). Both passive cooling pallets and active cooling pallets can be adapted to receive a cleanable rim.

Figure 12B:
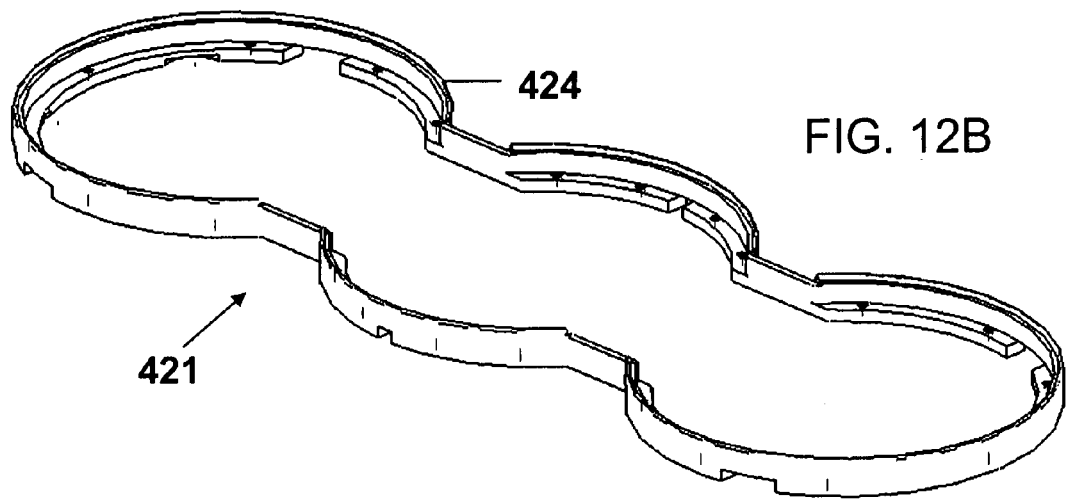
FIG. 12B is a top view of the cleanable rim removed from the substrate processing pallet of FIG. 12A.

FIG. 12B shows a cleanable rim 421 adapted to attach to the pallet 420. The rim edge 424 can contain substrate alignment and/or containment features. Such features can be used to prevent rotation of substrates and/or to prevent substrate loss during transport. The rim 421 is fabricated from a metal that is resistant to attack by chemical cleaning agents.

Figure 12C:
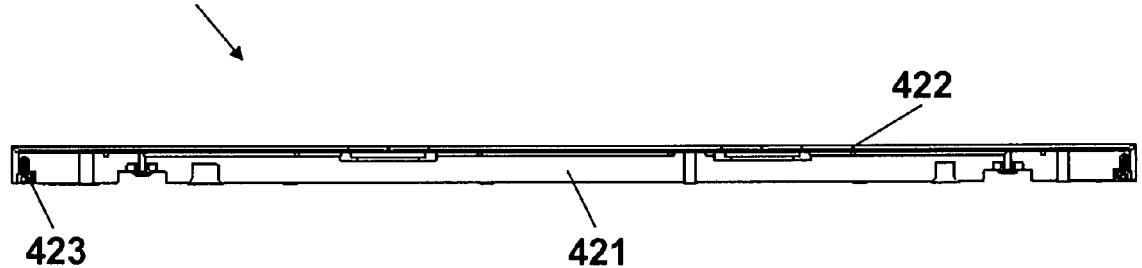
FIG. 12C is a cross-sectional view of the substrate processing pallet of FIG. 12A.

FIG. 12C shows a pallet assembly 426 with a cleanable rim 421 attached to the pallet body 422 by a bolt and the mount 423.

Figure 12D:
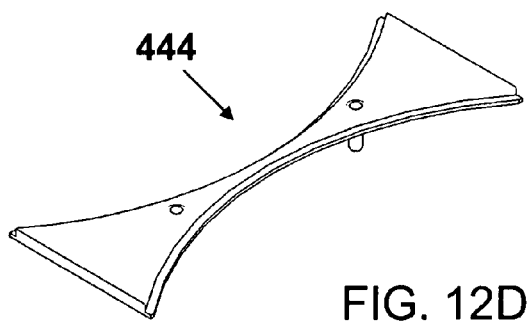
FIG. 12D is a perspective view of a cleanable cover for a substrate processing pallet.

FIG. 12D shows a cleanable cover 444, which can attach to the top of pallet 420 and can be removed for cleaning.

In various embodiments, combinations of cleanable rims and cleanable covers can mask a substrate processing pallet. For example, combinations of cleanable rims and cleanable covers can mask the exposed surfaces of substrate processing pallets such as those shown in FIGS. 4-7, to protect the pallets from processing and mitigate the need for cleaning the pallets. Rather, the cleanable rims and cleanable covers can be removed and cleaned. In various embodiments, cleanable rims and cleanable covers can be made from stainless steel.

FIG. 13A shows a processing shield 450 adapted to fit on top of a passive cooling pallet or an active cooling pallet. The shield includes a lip 451 defining a window 421. The shield 450 can allow plasma and/or reactants to interact with the substrate, but prevent plasma and/or reactants from interacting with the pallet.

FIG. 13B shows a cross-section of the shield 450, which includes a lip 451 having a shield rim 453 and a plasma acceptance channel 452. The window 421 can allow relatively unobstructed access to the substrate. To optimize processing, the window 421 should be of the minimum possible diameter that allows relatively unobstructed access to the substrate, but otherwise masks the pallet. For a window 421 diameter only marginally greater than the substrate diameter, relatively unobstructed access to the substrate requires accurate placement of the window 421 relative to the substrate. For example, the shield rim 453 should be aligned with the rim edge 424 to close tolerances. Process alignment features can facilitate close tolerance placement of the substrate relative to the pallet and close tolerance placement of the pallet relative to the shield 450.

Accurate placement of the substrate relative to the pallet requires accurate placement of the pallet in the load-lock, coupled with precise and accurate substrate handling, which can be achieved by robotic means. Pallet alignment features 388 and 389 in FIG. 8A align with load-lock tapered pins 412 and 413 in FIG. 3B. When the pallet 300 is pulled toward water-cooled lift plate 303 by suction cups 408, the tapered pins engage with the pallet features to accurately align the pallet for substrate loading. Accurate location of the pallet in the processing chamber with respect to the shield 450 is accomplished using alignment features and pins. Tapered alignment features in the processing chamber center the tray align with features 386 and 387 in FIG. 8A and center the tray when the features engage.

Experimental Example

A passive cooling pallet 130 as shown in FIG. 4 and an active cooling pallet 325 as shown in FIG. 6B were fabricated and subjected to identical processing conditions as an Aluminum Silicon Tray Assembly (ASTA) Part No. K11007815, which has silicon interface pads bonded to an aluminum base. The substrates used were three 200 mm diameter 750 micron thick silicon wafers. A 2-micron aluminum metal film was deposited on the substrates using a NIMBUS™ XP magnetron sputtering system available from NEXX Systems, Inc. of Billerica, Mass. The magnetron sputtering power was 23 kW, the deposition time was 212 s, and the background gas pressure in the processing chamber was 2.5 mTorr. Non-reversible temperature indicating labels were attached to each substrate to record the maximum attained temperature.

Table 2 shows that substrates on the passive cooling pallet 130 and the active cooling pallet 325 were cooled to lower temperatures than when processed using the ASTA pallet. In addition, the passive cooling pallet 130 did not fracture under the test conditions, whereas a portion of the ASTA pallet did.

TABLE 2

Measurements of the maximum temperature achieved by silicon wafer substrates when transported by various substrate pallets of the passive and active type and subjected to the same PVD processing recipe. Substrates were 200 mm diameter silicon wafer substrates.

| Pallet Type | Backside Gas Pressure (mTorr) | Pad Thickness (mm) | Max. Substrate Temperature (° C.) |
|---|---|---|---|
| ASTA pallet | 2.5 | 0.75 | 250 ± 3 |
| Passive cooling pallet 130 | 2.5 | 1.25 | 240 ± 9 |
| Active cooling pallet 325 | 2500 | 1.25 | 60 ± 5 |

While the invention has been particularly shown and described with reference to specific embodiments, it should be understood by those skilled in the art that various changes in form and detail may be made without departing from the spirit and scope of the invention as defined by the appended claims.

What is claimed is:

1. A substrate processing apparatus comprising:
   (a) a substrate processing pallet including:
      (i) a base member configured so that the pallet is moveable, with a substrate thereon, from a first chamber to a second chamber in a substrate processing system, the base member having a transport coupling surface configured to couple the base member to a pallet transport,
      (ii) a thermal interface pad connected to the base member, the thermal interface pad formed of a composite material having a thermal conductivity that is substantially similar to a thermal conductivity of the base member, wherein the composite material includes a metal base plate,
      (iii) an electrostatic chuck connected to the thermal interface pad, the electrostatic chuck configured to grip the substrate during processing,
      (iv) an energy storage system moveable with the pallet, the energy storage system being configured for storing energy to sustain the electrostatic chuck at sufficient charge to sustain gripping the substrate during processing, and
      (v) a gas transport mechanism connected to the base member and configured for transporting gas to a backside of the substrate to facilitate cooling of the substrate, the gas transport mechanism having a coupling to a gas source in the transport coupling surface;
   (b) a load-lock module including a charging system configured to charge the substrate pallet; and
   (c) a processing chamber coupled to the load-lock module, the processing chamber including at least one transport finger configured to supply gas to the substrate processing pallet, wherein the at least one transport finger is in communication with the gas transport mechanism of the substrate processing pallet.

2. The substrate processing apparatus of claim 1 wherein the base member comprises aluminum.

3. The substrate processing apparatus of claim 1 wherein the composite material comprises an alumina particulate and a polymer matrix.

4. The substrate processing apparatus of claim 1 wherein the pallet further comprises a removable, chemically resistant cover for facilitating cleaning.

5. The substrate processing apparatus of claim 4 wherein in the chemically resistant cover comprises a feature adapted for positioning and/or gripping the substrate.

6. The substrate processing apparatus of claim 1 further comprising an interface layer disposed between the pallet and a means for cooling the pallet to facilitate thermal conductance between the pallet and the means for cooling the pallet.

7. The substrate processing apparatus of claim 1 wherein the energy storage system comprises a high voltage capacitor.

8. The substrate processing apparatus of claim 7 wherein the high voltage capacitor comprises polypropylene film.

9. The substrate processing apparatus of claim 1 wherein the electrostatic chuck comprises a polyimide.

10. The substrate processing apparatus of claim 1 wherein the gas transport mechanism comprises a gas channel, a gas channel seal, a gas distribution system within the pallet, and a gas delivery outlet for uniform gas delivery.

11. The substrate processing apparatus of claim 1 wherein the electrostatic chuck further comprises a discharge circuit for automatically discharging the energy storage system.

12. The substrate processing apparatus of claim 1, wherein the at least one transport finger engages with a suction cup included in the substrate processing pallet.

13. The substrate processing apparatus of claim 1 wherein the interface pad has substantially the same coefficient of thermal expansion as the base member.

14. The substrate processing apparatus of claim 1 wherein the energy storage system includes a shield coupling movable between a first and second positions where when in the first position the shield coupling communicates power to the energy storage system and when in the second position the shield coupling substantially prevents charged particles from entering a housing of the energy storage system.

15. The substrate processing apparatus of claim 14, wherein the shield comprises a metal cover adapted to lift during charging and cover the conductor during processing.

16. The substrate processing apparatus of claim 14 further comprising:
a charger for charging the energy storage system; and
a conductor for conducting energy from the energy storage system;
wherein the shield coupling is configured for preventing charged particles from contacting the conductor when in the second position.

17. The substrate processing apparatus of claim 16 wherein the charger comprises a spring loaded contact providing power.

18. The substrate processing apparatus of claim 1 wherein the coupling is configured to couple to the gas source during processing of the pallet.

19. The substrate processing apparatus of claim 1, wherein the interface pad is formed of polytetrafluoroethylene (PTFE).

20. The substrate processing apparatus according to claim 1, wherein the composite material further includes an alumina particulate formed in a matrix of polytetrafluoroethylene (PTFE) that is laminated to the metal base plate.

21. The substrate processing apparatus according to claim 1, wherein the composite material further includes a dielectric having a first thickness, wherein the dielectric is laminated to the metal base plate, and wherein the base plate has a second thickness greater than the first thickness.

22. The substrate processing apparatus according to claim 1, wherein the metal base plate of the composite material is aluminum.

23. The substrate processing apparatus according to claim 1, further comprising a bonding layer between the base member and the thermal interface pad.

24. The substrate processing apparatus according to claim 1, wherein the load-lock module includes a water cooled plate in thermal communication with the pallet.

25. The substrate processing apparatus according to claim 1, further comprising a sensor for measuring a gas pressure at the backside of the substrate.

26. The substrate processing apparatus according to claim 1, wherein the substrate processing pallet includes a gas inlet and the at least one transport finger includes a gas hole, wherein the gas hole is aligned with the gas inlet.

27. The substrate processing apparatus according to claim 1, wherein the load-lock module includes a lift plate configured to support the substrate processing pallet and a gas transport finger configured to supply gas to the substrate processing pallet, wherein the lift plate, in a first position, is connected to the charging system, and wherein the lift plate, in a second position, rests on the gas transport finger of the load-lock module.

* * * * *